US012640719B2

(12) United States Patent
Fayneh et al.

(10) Patent No.: US 12,640,719 B2
(45) Date of Patent: May 26, 2026

(54) INTEGRATED CIRCUIT GLITCH DETECTION

(71) Applicant: PROTEANTECS LTD., Haifa (IL)

(72) Inventors: Eyal Fayneh, Givatayim (IL); Guy Redler, Haifa (IL); Faten Tanasra, Nazareth (IL); Alex Khazin, Nesher (IL); Evelyn Landman, Haifa (IL)

(73) Assignee: PROTEANTECS LTD., Haifa (IL)

( * ) Notice: Subject to any disclaimer, the term of this patent is extended or adjusted under 35 U.S.C. 154(b) by 71 days.

(21) Appl. No.: 18/892,957

(22) Filed: Sep. 23, 2024

(65) Prior Publication Data

US 2025/0112626 A1 Apr. 3, 2025

Related U.S. Application Data

(60) Provisional application No. 63/541,017, filed on Sep. 28, 2023.

(51) Int. Cl.
H03K 5/135 (2006.01)
H03K 5/14 (2014.01)
H03K 19/20 (2006.01)

(52) U.S. Cl.
CPC ............... H03K 5/14 (2013.01); H03K 5/135 (2013.01); H03K 19/20 (2013.01)

(58) Field of Classification Search
CPC ........... H03K 5/135; H03K 5/14; H03K 19/20
USPC .................................................. 327/24, 25
See application file for complete search history.

(56) References Cited

U.S. PATENT DOCUMENTS

| | | | | |
|---|---|---|---|---|
| 5,903,605 A | * | 5/1999 | Crittenden | ........ H04L 25/03019 |
| | | | | 370/518 |
| 7,254,507 B2 | | 8/2007 | Dosho et al. | |
| 2007/0120584 A1 | * | 5/2007 | Carlile | .................. H03L 7/0891 |
| | | | | 327/156 |
| 2017/0214516 A1 | | 7/2017 | Rivaud et al. | |
| 2022/0197332 A1 | * | 6/2022 | Sinha | ........................ G06F 1/14 |

(Continued)

FOREIGN PATENT DOCUMENTS

| | | |
|---|---|---|
| JP | 2009065533 A | 3/2009 |
| KR | 20130110989 A | 10/2013 |
| WO | 2010083920 A1 | 7/2010 |

OTHER PUBLICATIONS

Agilent Technologies, "Clock Jitter Analysis with Femto-Second Resolution," Online at https://www.synopsys.com/content/dam/synopsys/optical/e-newsletter-pdfs/Clock_Jitter_Analysis_2008.pdf (2008).

*Primary Examiner* — William Hernandez
(74) *Attorney, Agent, or Firm* — The Roy Gross Law Firm, LLC; Roy D. Gross

(57) ABSTRACT

Glitch detection is provided for a clock signal in a semiconductor integrated circuit (IC), for example between an input buffer and a Phase Locked Loop (PLL). A first pulse signal is generated in response to a rising edge of the clock signal, and a second pulse signal is generated in response to its falling edge. A third pulse signal is generated at a predetermined period of time after a start of the first pulse signal, and a fourth pulse signal is generated at a predetermined period of time after a start of the second pulse signal. A glitch in the clock signal is indicated based on the third pulse signal having an opposite logical level to the clock signal, and/or based on the fourth pulse signal having the same logical level as the clock signal.

20 Claims, 14 Drawing Sheets

(56) References Cited

U.S. PATENT DOCUMENTS

| | | | | |
|---|---|---|---|---|
| 2022/0199191 A1* | 6/2022 | Nguyen | ................. | G11C 29/50 |
| 2023/0377675 A1* | 11/2023 | Nguyen | ........... | G11C 29/50012 |
| 2025/0298080 A1* | 9/2025 | B | ........................... | H03K 3/037 |

* cited by examiner

FIG.12

800 — GENERATE PULSE SIGNAL IN RESPONSE TO CLOCK SIGNAL EDGE

810 — GENERATE DELAYED PULSE SIGNAL

820 — COMPARE DELAYED PULSE SIGNAL WITH CLOCK SIGNAL

1

INTEGRATED CIRCUIT GLITCH DETECTION

CROSS-REFERENCE TO RELATED APPLICATIONS

This application claims priority to U.S. Provisional Patent Application No. 63/541,017, filed Sep. 28, 2023, entitled "Integrated Circuit Glitch Detection," the contents of which are incorporated herein in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs. Digital ICs contain billions of transistors, such as metal-oxide semiconductor field-effect transistor (MOSFETs), arranged in functional and/or logical units on the wafer, with data paths interconnecting the functional units that transfer data values between the functional units. Each unit has a power source and an associated on power, off power, standby power, and the like.

ICs may use a clock signal, typically of a square-wave shape, for a variety of purposes, for example synchronization in a digital circuit or as a reference signal to a Phase Locked Loop (PLL). The edges of the clock signal are used to define one or more of: timing intervals; frequency; and phase, for example. Noise, interference, circuit degradation and other factors may cause distortion of the clock signal. This can lead to problems with edge detection and, in particular, detection of an edge where the correct clock signal would not have an edge. This may be termed a glitch (or logic hazard). Where the clock signal is used as a reference signal to a PLL, such glitches can degrade the PLL output and in severe cases, unlock the PLL.

One known technique for monitoring such degradation involves a PLL device that uses a reference clock signal and a local oscillator to produce an extracted clock signal. An error detector includes functionality to detect an amount of phase error and/or an amount of frequency error in the extracted clock signal using the reference clock signal. A frequency error signal may be obtained from the extracted clock signal and the reference clock signal and transmitted to the PLL device to synchronize the extracted clock signal with a reference clock signal. A phase error signal may also be transmitted from the error detector to the PLL device for adjusting the extracted clock signal.

The foregoing examples of the related art and limitations related therewith are intended to be illustrative and not exclusive. Other limitations of the related art will become apparent to those of skill in the art upon a reading of the specification and a study of the figures.

2

SUMMARY

The following embodiments and aspects thereof are described and illustrated in conjunction with systems, tools and methods which are meant to be exemplary and illustrative, not limiting in scope.

In a first aspect, there is provided a glitch detection circuit for a clock signal in a semiconductor integrated circuit (IC), the glitch detection circuit comprising: an edge detector, configured to generate a first pulse signal in response to a rising edge of the clock signal and a second pulse signal in response to a falling edge of the clock signal; a delayed-pulse generator, configured to generate a third pulse signal at a predetermined period of time after a start of the first pulse signal and to generate a fourth pulse signal at a predetermined period of time after a start of the second pulse signal; and a glitch identifier, configured to indicate a glitch in the clock signal based on the third pulse signal having an opposite logical level to the clock signal and/or based on the fourth pulse signal having the same logical level as the clock signal.

In a further aspect, there is provided a non-transitory computer readable medium having stored thereon a computer-readable encoding of the glitch detection circuit.

In embodiments, a duration of the first pulse signal and/or a duration of second pulse signal are/is adjustable.

In embodiments, the first pulse signal and/or second pulse signal are configured to have a duration of less than 20% of a period of the clock signal.

In embodiments, the predetermined period of time for generating the third pulse signal is no more than 50% of a duration the first pulse signal and/or the predetermined period of time for generating the fourth pulse signal is no more than 50% of a duration the second pulse signal.

In embodiments, the glitch identifier is configured to maintain a plurality of counters, the plurality of counters comprising: a first counter, configured to count each indication of a glitch over a time period, based on third pulse signal having an opposite logical level to the clock signal and/or based on the fourth pulse signal having the same logical level as the clock signal; a second counter, configured to count over the time period each generation of the first pulse signal and each generation of the second pulse signal; and a third counter, configured to count over the time period the number of edges in a glitch-free version of the clock signal.

In embodiments, the glitch identifier is further configured to determine the number of phase glitches over the time period by subtracting the count provided by the first counter and the count provided by the third counter from the count provided by the second counter.

In embodiments, the glitch identifier is further configured to determine the number of slope glitches over the time period by subtracting the determined number of phase glitches from the count provided by the first counter.

In embodiments, the glitch detection circuit further comprises: a glitch-free clock generator, configured to provide a glitch-free version of the clock signal. In embodiments, the glitch-free clock generator comprises: a clock input, for receiving the clock signal with glitches; a delay circuit, for receiving the clock signal with glitches from the clock input and providing a delayed version of the received clock signal with glitches; an OR gate, configured to receive the clock signal with glitches from the clock input at a first OR gate input and to receive the delayed version of the received clock signal with glitches from the delay circuit at a second OR gate input; an AND gate, configured to receive the clock signal with glitches from the clock input at a first AND gate input and to receive the delayed version of the received clock signal with glitches from the delay circuit at a second AND gate input; and a SR latch configured to receive a signal based on an output of the OR gate at a first SR latch input and to receive a signal based on an output of the AND gate at a second SR latch input, an output of the SR latch being used to provide the glitch-free version of the clock signal.

In another aspect, there is provided a semiconductor Integrated Circuit (IC), comprising: a glitch detection circuit in accordance with any aspect or embodiment herein described, configured to receive a clock signal, analyze the received clock signal and generate a signal indicating the glitch in the clock signal based on the analyzing.

In a further aspect, there is provided a semiconductor Integrated Circuit (IC), comprising: an input buffer, configured to receive a clock signal; a Phase Locked Loop (PLL), configured to receive the clock signal from the input buffer; and the glitch detection circuit in accordance with any aspect or embodiment herein described, configured to receive the clock signal from the input buffer and/or the clock signal at the PLL, analyze the received clock signal and generate the signal indicating the glitch based on the analyzing.

In embodiments according to any aspect, the semiconductor IC further comprises: a PLL protection circuit, configured to mitigate a jitter effect on the clock signal at the PLL, in response to the signal indicating the glitch in the clock signal.

In embodiments, the glitch detection circuit is a first glitch detection circuit and is configured to receive the clock signal at an output of the input buffer, analyze the received clock signal and generate a first glitch signal indicating a glitch on the clock signal based on results of the analyzing, the semiconductor IC further comprising: a second glitch detection circuit, configured to receive the clock signal at an input to the PLL, analyze the received clock signal and generate a second glitch signal indicating a glitch on the clock signal based on results of the analyzing; a first jitter detector, configured to receive the clock signal at the output of the input buffer and generate a first jitter signal indicating jitter on the received clock signal; and a second jitter detector, configured to receive the clock signal at the input to the PLL and generate a second jitter signal indicating jitter on the received clock signal.

In embodiments, the semiconductor IC further comprises: a clock controller, configured to receive the first and second glitch signals and the first and second jitter signals and to identify a clock error state based on the received first and second glitch signals and the received first and second jitter signals.

In embodiments, the clock controller is configured to identify one or more of: (i) an external reference clock jitter, based on the first and second jitter signals indicating jitter and the first and second glitch signals not indicating a glitch; (ii) a clock routing jitter, based on the first jitter signal indicating no jitter, the second jitter signal indicating jitter and the first and second glitch signals not indicating a glitch; (iii) a non-failure state external reference clock glitch, based on the first glitch signal indicating a glitch, the second glitch signal not indicating a glitch and the second jitter signal indicating jitter; (iv) a failure-state external reference clock glitch, based on the first and second glitch signals indicating a glitch; and (v) a failure-state internal reference clock glitch, based on the first glitch signal not indicating a glitch and the second glitch signal indicating a glitch.

In a yet further aspect, there is provided a method for detecting a glitch of a clock signal in a semiconductor integrated circuit (IC), the method comprising: generating a first pulse signal in response to a rising edge of the clock signal and a second pulse signal in response to a falling edge of the clock signal; generating a third pulse signal at a predetermined period of time after a start of the first pulse signal and generating a fourth pulse signal at a predetermined period of time after a start of the second pulse signal; and indicating a glitch in the clock signal based on third pulse signal having an opposite logical level to the clock signal and/or based on the fourth pulse signal having the same logical level as the clock signal.

In embodiments, a duration of the first pulse signal and/or a duration of second pulse signal are/is adjustable.

In embodiments, the first pulse signal and/or second pulse signal have a duration of less than 20% of a period of the clock signal.

In embodiments, the predetermined period of time for generating the third pulse signal is no more than 50% of a duration the first pulse signal and/or the predetermined period of time for generating the fourth pulse signal is no more than 50% of a duration the second pulse signal.

In embodiments, the method further comprises: counting each indication of a glitch over a time period, based on third pulse signal having an opposite logical level to the clock signal and/or based on the fourth pulse signal having the same logical level as the clock signal, to provide a first count; counting over the time period each generation of the first pulse signal and each generation of the second pulse signal to provide a second count; and counting over the time period the number of edges in a glitch-free version of the clock signal to provide a third count.

In embodiments, the method further comprises determining the number of phase glitches over the time period by subtracting the first count and the third count from the second count.

In embodiments, the method further comprises determining the number of slope glitches over the time period by subtracting the determined number of phase glitches from the first count.

In embodiments, the method further comprises: providing a glitch-free version of the clock signal. In embodiments, wherein the step of providing a glitch-free version of the clock signal comprises: providing a delayed version of the received clock signal with glitches; receiving the clock signal with glitches at a first input of an OR gate and receiving the delayed version of the received clock signal with glitches at a second input of the OR gate; receiving the clock signal with glitches at a first input of an AND gate and receiving the delayed version of the received clock signal with glitches at a second input of the AND gate; and receiving a signal based on an output of the OR gate at a first input of a SR latch and receiving a signal based on an output of the AND gate at a second input of the SR latch, an output of the SR latch being used to provide the glitch-free version of the clock signal.

In yet another aspect, there is provided a method for operating a semiconductor Integrated Circuit (IC), comprising: receiving a clock signal at an input buffer of the semiconductor IC; providing the clock signal from the input buffer to a Phase Locked Loop (PLL); checking for a glitch in the clock signal provided by the input buffer and/or provided to the PLL. In embodiments, the step of checking for a glitch comprises detecting a glitch in accordance with any aspect or embodiments described herein.

In embodiments according to any aspect, the method further comprises: mitigating a jitter effect on the clock signal at the PLL, in response to the step of checking for a glitch.

In embodiments, the step of checking comprises checking for a first glitch in the clock signal at an output of the input buffer, the method further comprising: checking for a second glitch in the clock signal at an input to the PLL; checking for a first jitter in the clock signal at the output of the input buffer; and checking for a second jitter in the clock signal at the input to the PLL.

In embodiments, the method further comprises: identifying a clock error state based on the results of the steps of checking for a first glitch, a second glitch, a first jitter and a second jitter.

In embodiments, the method further comprises identifying one or more of: (i) an external reference clock jitter, based on the first and second jitters being detected and the first and second glitches not being detected; (ii) a clock routing jitter, based on the first jitter not being detected, the second jitter being detected and the first and second glitches not being detected; (iii) a non-failure state external reference clock glitch, based on the first glitch being detected, the second glitch not being detected and the second jitter being detected; (iv) a failure-state external reference clock glitch, based on the first and second glitches being detected; and (v) a failure-state internal reference clock glitch, based on the first glitch not being detected and the second glitch being detected.

In addition to the exemplary aspects and embodiments described above, further aspects and embodiments will become apparent by reference to the figures and by study of the following detailed description. Moreover, the various features and embodiments of the invention described above are specifically contemplated to be used alone as well as in various combinations.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIG. 12 shows a timing diagram for signals as part of a device for glitch detection in accordance with an aspect of the disclosure, depicting resolution for detectable glitches;

DETAILED DESCRIPTION

Figure 1:
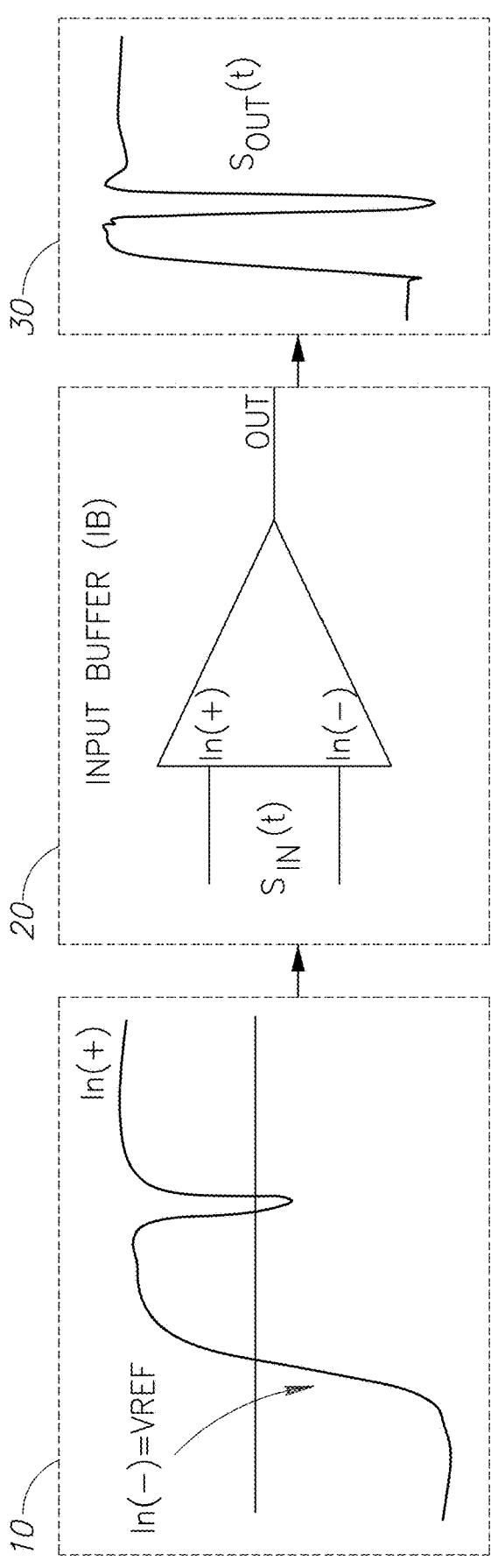
FIG. 1 shows a schematic block diagram of an example clock signal integrity failure in a single ended mode case.

Reference is made to FIG. 1, which shows a schematic block diagram of an example clock signal integrity failure in a single ended mode case. A clock signal 10 is provided to an input buffer (IB) 20 on a semiconductor IC, which provides an output signal 30 accordingly. The output signal 30 may be provided to a Phase Locked Loop (PLL), not shown, as a reference clock. A loss of signal integrity on the clock signal 10 provided to the input buffer 20 may cause edges to appear in the output signal 30 that were not present on the original clock signal.

Figure 2:
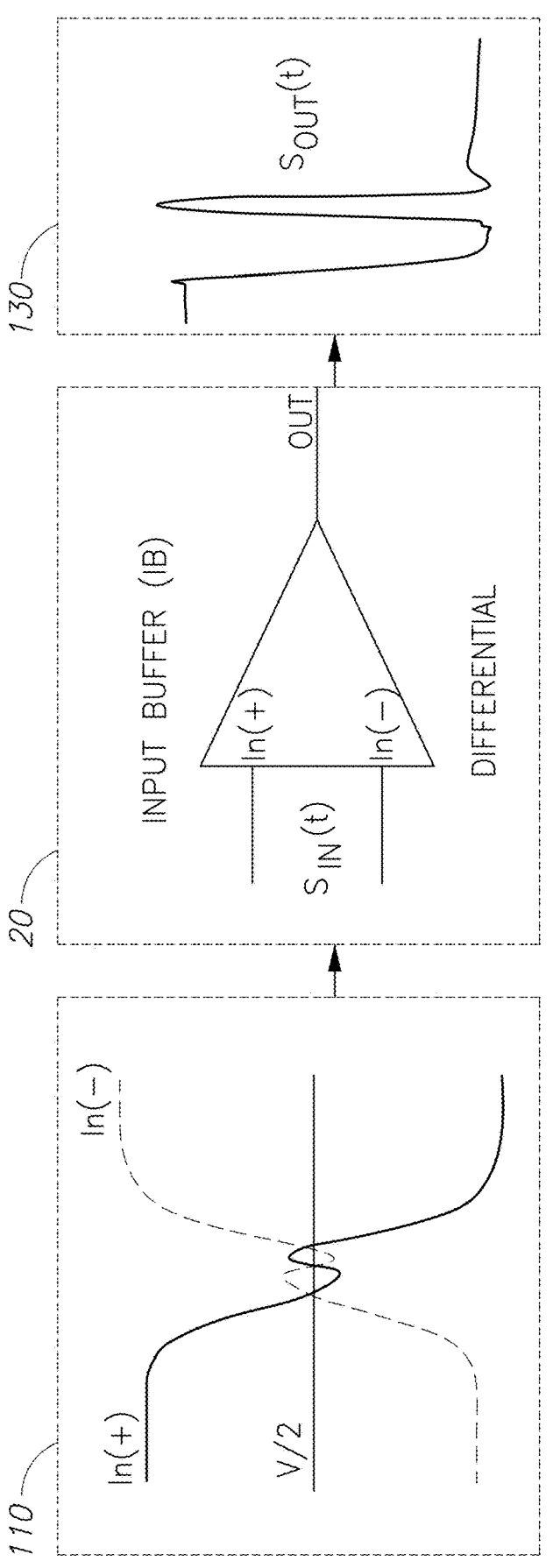
FIG. 2 shows a schematic block diagram of an example clock signal integrity failure in a differential mode case.

Reference is also made to FIG. 2, which shows a schematic block diagram of an example clock signal integrity failure in a differential mode case. Here, a differential mode clock signal 110 is provided to an IB 20, which provides a single-ended output signal 130 accordingly. In this case, it will be seen that only a small degradation of the clock signal 110, for example caused by reflections on the clock lines, may result in significant edges to appear in the output signal 130.

In all these cases, causes or sources of poor clock signal integrity over a physical channel, for instance a conductor on an IC, may include one or more of: frequency dependent attenuation; frequency dependent delay (dispersion); cross-talk; reflection; supply noise (driver/receiver); and electro-magnetic interference (EMI). Impairments causing or sourcing poor clock signal integrity may be nonlinear and/or time-variant.

The addition of edges to the IB output may cause glitches, for example causing the PLL to "double click". If filtered, these glitches may degrade the PLL output clock with jitter. In severe cases, this can unlock the PLL, as discussed above.

The present disclosure recognizes that detecting such problems at the output of the IB 20, so that an alert can be provided, may mitigate the risk of problems or harm to a PLL receiving the output signal. Indicating a fault before failure can significantly improve the performance of the IC, as well as robustness and yield.

Figure 3:
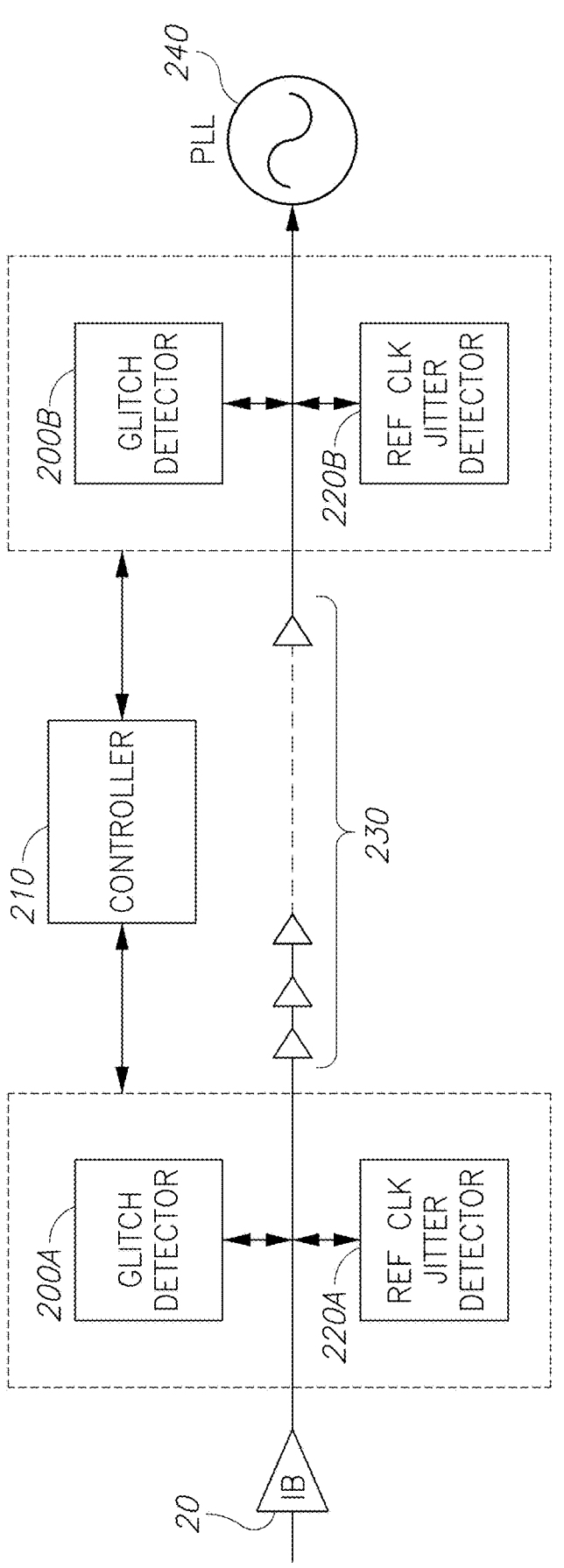
FIG. 3 shows a schematic block diagram of an input buffer to Phase Locked Loop (PLL) path comprising glitch detection in accordance with an aspect of the disclosure.

Reference is now made to FIG. 3, which shows a schematic block diagram of an input buffer to Phase Locked Loop (PLL) path comprising glitch detection. The block diagram shows a path between an IB 20 and a PLL 240. Other buffers 230 along the path may further affect the clock signal provided by the IB 20, for instance filtering the clock signal provided by the IB 20.

At the output of the IB 20, a first glitch detector agent 200A is connected. A second glitch detector agent 200B is also connected at the input to the PLL 240. A controller 210 manages operation and/or outputs of the glitch detector agents 200A, 200B. The glitch detector agents 200A, 200B are sensitive to narrow glitches that are converted into jitter in the input clock of the PLL 240. The glitch detector agents 200A, 200B produce a digital output reflecting the glitches incident in the reference clock during a measurement time, which represents the clock integrity quality.

Also provided is a first reference clock jitter detector 220A at the output of the IB 20. A second reference clock jitter detector 220B is provided at the input to the PLL 240. The controller 210 also manages operation and/or outputs of the reference clock jitter detectors 220A, 220B. Jitter in the input clock of the PLL 240 can be caused by one or more of: jitter in the output of the IB 20; glitches in the output of the IB 20 (which may be filtered by the clock path between the IB 20 and PLL 240); and noise in the clock path between the IB 20 and PLL 240.

The operation of the glitch detector agents 200A, 200B in monitoring reference clock integrity is now described. In a first case, jitter is detected at the output of the IB 20 by the first reference clock jitter detector 220A, no glitches are detected by the first glitch detector agent 200A and jitter is also detected the second reference clock jitter detector 220B at the input to the PLL 240. In this case, the controller 210 alerts the IC about the jitter amplitude and the source of the jitter, specifically jitter of the external reference clock.

In a second case, jitter is detected by the second reference clock jitter detector 220B at the input to the PLL 240, no glitches are detected by the glitch detector agents 200A, 200B, but no jitter is detected at the output of the IB 20 by the first reference clock jitter detector 220A. Here, the controller 210 alerts the IC about the jitter amplitude and the source of the jitter, specifically the buffers 230 providing the clock routing.

In a third case, glitches are detected at the output of the IB 20 by the glitch detector agent 200A there, but no glitches are detected by the second glitch detector agent 200B at the PLL 240. However, jitter is detected the second reference clock jitter detector 220B at the input to the PLL 240. Hence, the glitches are probably filtered by the buffers 230, such that the glitches are converted into jitter at the input to the PLL 240. In this case, the controller 210 alerts the IC about glitches at the output of the IB 20, caused by the external reference clock.

In a fourth case, glitches are detected both at the output of the IB 20 by the glitch detector agent 200A there and by the second glitch detector agent 200B at the input to the PLL 240. In this case, the IC will fail. The controller 210 alerts the IC about glitches at the input to the PLL 240 and that the source of glitches is the external reference clock.

In a fifth case, no glitches are detected at the output of the IB 20 by the glitch detector agent 200A there, but glitches are detected by the second glitch detector agent 200B at the PLL 240. In this case, the IC will fail. The controller 210 alerts the IC about glitches at the input to the PLL 240 and that the source of glitches is the internal reference clock.

In general terms, there may therefore be considered a semiconductor Integrated Circuit (IC), comprising: an input buffer, configured to receive a clock signal; a Phase Locked Loop (PLL), configured to receive the clock signal from the input buffer; and a glitch detection circuit, arranged (i.e., configured) to receive the clock signal from the input buffer and/or the clock signal at the PLL, analyze the received clock signal and generate a signal indicating a glitch on the clock signal based on results of the analyzing (in particular, without a need to use an output of the PLL). In this way, the IC may be protected from glitch or jitter errors, causing problems. The glitch detection circuit may be of any form as described herein, particular in line with any glitch detection circuit as described below (in general terms or otherwise). Optionally, a PLL protection circuit may be provided. The PLL protection circuit may be configured to mitigate a jitter effect on the clock signal at the PLL, for example in response to the signal indicating a glitch on the clock signal. The PLL protection circuit may disconnect or shutdown the PLL or alert the chip about a clock integrity problem. Mitigation action may prevent damage to the PLL or another part of the IC resulting from jitter or PLL unlock.

In embodiments, two glitch detection circuits may be provided. A first glitch detection circuit is arranged to receive the clock signal at an output of the input buffer, analyze the received clock signal and generate a first glitch signal indicating a glitch on the clock signal based on results of the analyzing. A second glitch detection circuit is arranged to receive the clock signal at an input to the PLL, analyze the received clock signal and generate a second glitch signal indicating a glitch on the clock signal based on results of the analyzing.

In embodiments, one or more jitter detectors may additionally be provided. A first jitter detector may be configured to receive the clock signal at the output of the input buffer and generate a first jitter signal indicating jitter on the received clock signal. A second jitter detector may be configured to receive the clock signal at the input to the PLL and generate a second jitter signal indicating jitter on the received clock signal.

In embodiments, a clock controller is configured to receive the first and second glitch signals and the first and second jitter signals and to identify (and/or indicate) a clock error state based on the received first and second glitch signals and the received first and second jitter signals. The clock controller may also indicate a jitter amplitude and/or source. In particular, the clock controller may be configured to identify one or more of: (i) an external reference clock jitter, based on the first and second jitter signals indicating jitter and the first and second glitch signals not indicating a glitch; (ii) a clock routing jitter, based on the first jitter signal indicating no jitter, the second jitter signal indicating jitter and the first and second glitch signals not indicating a glitch; (iii) a non-failure state external reference clock glitch, based on the first glitch signal indicating a glitch, the second glitch signal not indicating a glitch and the second jitter signal indicating jitter; (iv) a failure-state external reference clock glitch, based on the first and second glitch signals indicating a glitch; and (v) a failure-state internal reference clock glitch, based on the first glitch signal not indicating a glitch and the second glitch signal indicating a glitch.

In another aspect, there may be considered a method for operating a semiconductor Integrated Circuit (IC), comprising: receiving a clock signal at an input buffer of the semiconductor IC; providing the clock signal from the input buffer to a Phase Locked Loop (PLL); checking for (and/or detecting) a glitch in the clock signal provided by the input buffer and/or provided to the PLL (without need to use an output of the PLL). The step of checking for (and/or detecting) a glitch may be in accordance with any glitch detection method as described herein (in general terms or otherwise). Optionally, the method may further comprise mitigating a jitter effect on the clock signal at the PLL, in response to the step of detecting a glitch.

Optionally, the step of checking comprises: checking for a first glitch in the clock signal at an output of the input buffer; and checking for a second glitch in the clock signal at an input to the PLL. In addition, the method may comprise: checking for a first jitter in the clock signal at the output of the input buffer; and/or checking for a second jitter in the clock signal at the input to the PLL. Advantageously, the method may further comprise identifying (and/or indicating) a clock error state based on the results of the steps of checking for a first glitch, a second glitch, a first jitter and a second jitter (and optionally indicating a jitter amplitude and/or source). For example, this may comprise identifying one or more of: (i) an external reference clock jitter, based on the first and second jitters being detected and the first and second glitches not being detected; (ii) a clock routing jitter, based on the first jitter not being detected, the second jitter being detected and the first and second glitches not being detected; (iii) a non-failure state external reference clock glitch, based on the first glitch being detected, the second glitch not being detected and the second jitter being detected; (iv) a failure-state external reference clock glitch, based on the first and second glitches being detected; and (v) a failure-state internal reference clock glitch, based on the first glitch not being detected and the second glitch being detected.

Specific embodiments will be described below, with particular reference to glitch detection. Further generalized descriptions will also be provided subsequently. These may be combined with other generalized or specific descriptions in the present disclosure.

Figure 4:
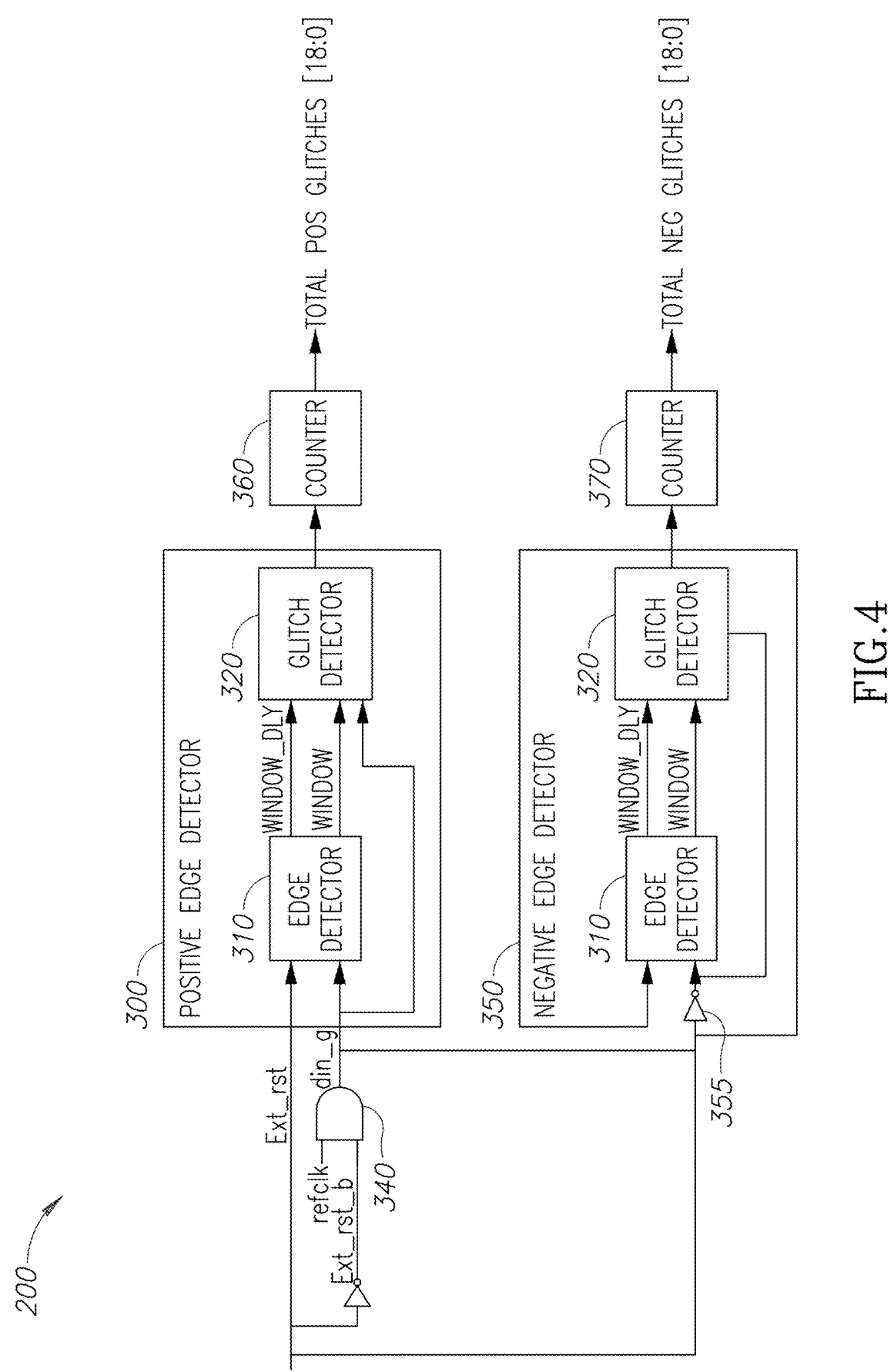
FIG. 4 shows a schematic block diagram of a first device for glitch detection in accordance with an aspect of the disclosure.

Reference is made to FIG. 4, which shows a schematic block diagram of a first implementation of a glitch detector agent 200. The input signals to the glitch detector agent 200 are: a clock signal (refclk); and a reset signal (Ext_rst). An AND gate 340 is provided with the clock signal and an inverted version of the reset signal. The reset signal and the output of the AND gate 340 are provided to a positive edge glitch detector 300 and a negative edge glitch detector 350. The positive edge glitch detector 300 and the negative edge glitch detector 350 each comprise: an edge detector 310; and a glitch detector 320. The positive edge glitch detector 300 and the negative edge glitch detector 350 are the same as each other, except for the addition of an inverter 355 on the path from the output of the AND gate 340 to the edge detector 310 on the negative edge glitch detector 350.

The positive edge detector 300 provides two outputs: a positive edge glitch signal (Trig_pos); and a positive edge signal (win_pos). The negative edge detector 350 provides two outputs: a negative edge glitch signal (Trig_neg); and a negative edge signal (win_neg). A first counter gate 360 receives the positive edge glitch signal to provide a positive glitch signal count output. A second counter 370 receives the positive edge signal to provide a negative glitch signal count output.

Figure 5:
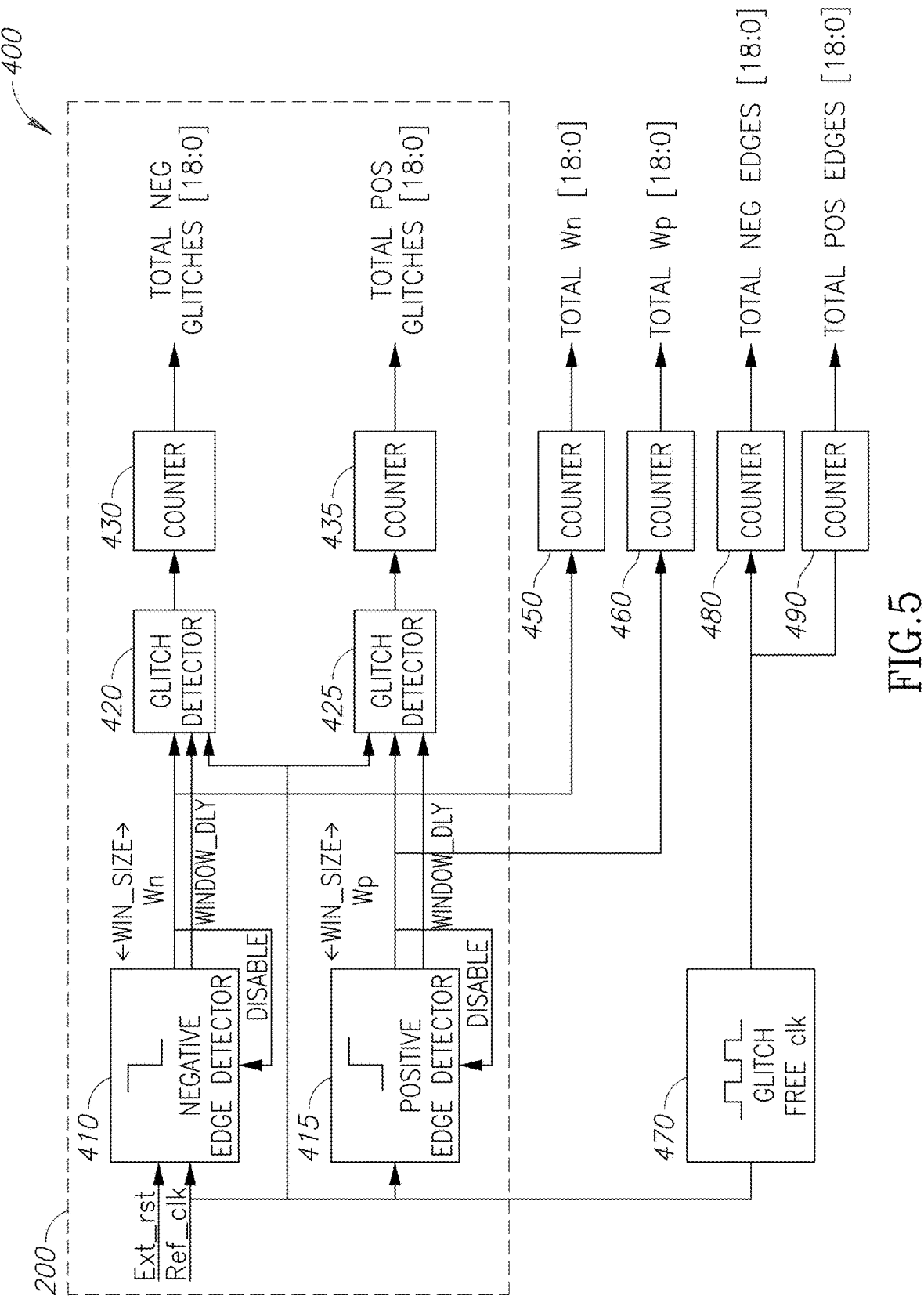
FIG. 5 shows a schematic block diagram of a second device for glitch detection in accordance with an aspect of the disclosure.

Reference is made to FIG. 5, which shows a schematic block diagram of a second device for glitch detection 400. This may be an alternative to the design shown in FIG. 4 and indeed, optionally incorporates the previously-described glitch detector agent 200. Sub-combinations of the two implementations are also possible. The device for glitch detection 400 has two inputs: a clock signal (Ref_clk); and a reset signal (Ext_rst). The device for glitch detection 400 comprises: a negative edge detector 410; a positive edge detector 415; a first glitch detector 420; a second glitch detector 425; a negative glitch counter 430; a positive glitch counter 435; a negative edge counter 450; a positive edge counter 460; a glitch filter circuit 470; a filtered clock negative edge counter 480; and a filtered clock positive edge counter 490.

The clock signal is provided as an input to the negative edge detector 410 and the positive edge detector 415. The negative edge detector 410 produces a negative edge pulse signal (Wn) when a negative edge is detected (the negative edge detector 410 being disabled until the end of the negative edge pulse signal). The positive edge detector 415 produces a positive edge pulse signal (Wp) when a positive edge is detected (the positive edge detector 415 being disabled until the end of the positive edge pulse signal). The negative edge pulse signal and the clock signal are provided as inputs to the first glitch detector 420, which uses them to detect a negative glitch and provides this indication to the negative glitch counter 430. The positive edge pulse signal and the clock signal are provided as inputs to the second glitch detector 425, which uses them to detect a positive glitch and provides this indication to the positive glitch counter 435.

The negative edge counter 450 also receives the negative edge pulse signal to count the total number of negative edges. The positive edge counter 460 also receives the positive edge pulse signal to count the total number of positive edges. The glitch filter circuit 470 receives the clock signal and filters out glitches to provide a glitch-free clock signal. The glitch-free clock signal is provided to: the filtered clock negative edge counter 480 to provide a count of glitch-free negative edges; and the filtered clock positive edge counter 490 to provide a count of glitch-free positive edges.

Figure 6:
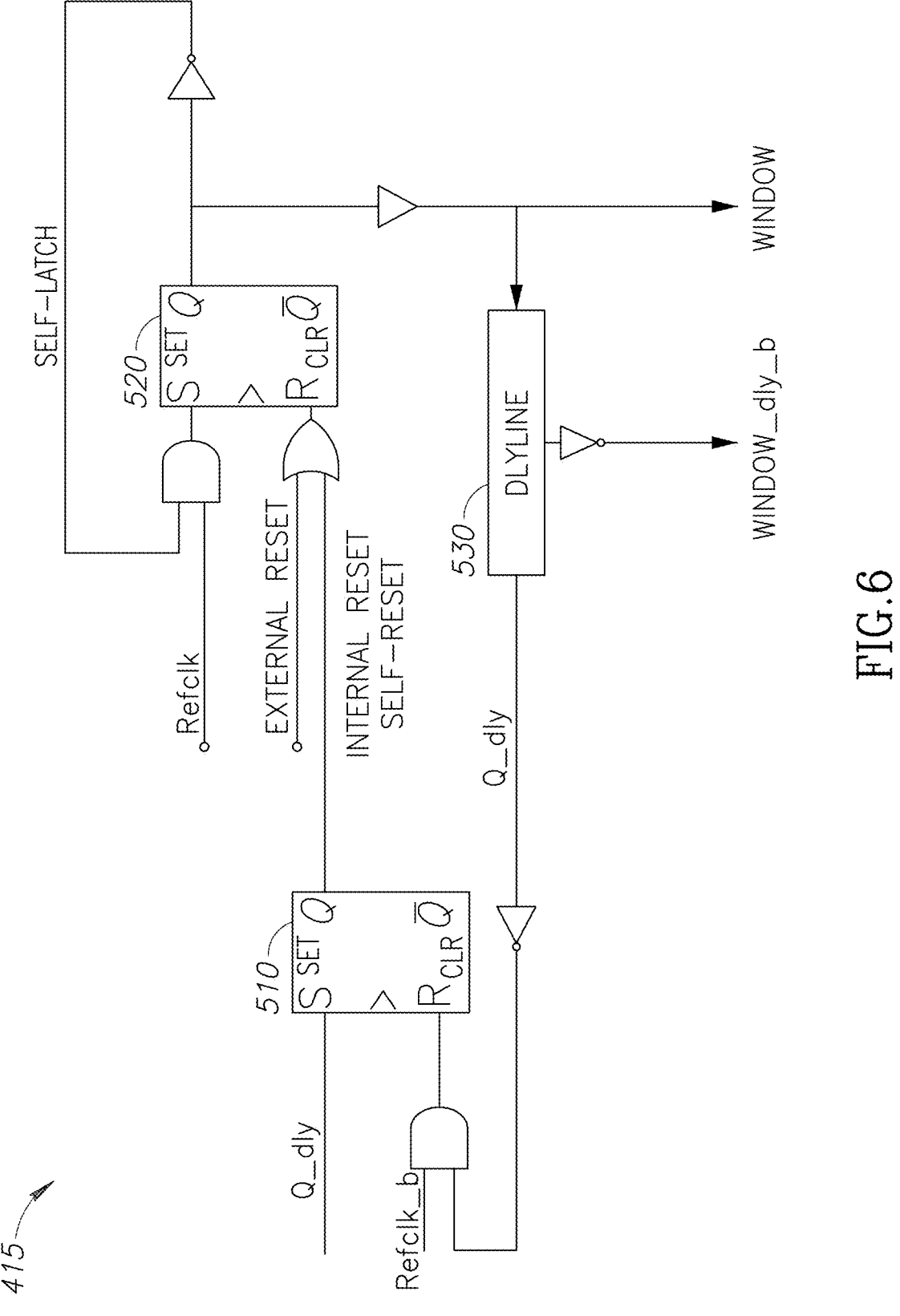
FIG. 6 shows a schematic block diagram of a positive edge detector for use in a device for glitch detection in accordance with an aspect of the disclosure.

Reference is made to FIG. 6, which shows a schematic block diagram of a positive edge detector 415 for use in the device for glitch detection 400 of FIG. 5. This uses a first SR latch 510, a second SR latch 520 with a delay line circuit 530 between them. A similar design may be considered for the negative edge detector 410 of FIG. 5. Thus, the edge detector circuit comprises the first SR latch 510 with a self-reset and self-latch system. When there is a rising transition in the clock signal, the edge detector 415 generates a pulse in its output with a configured duration (window size). This size is set by the delay line circuit 530. After external reset, the positive edge detector 415 is ready to respond to clock signal rising edges. When the clock signal rises it sets the Q output of the first SR latch 510 to a logical high level ('1') and holds the system in latch mode by blocking the clock signal. The Q output stays at a logical high level for "window size" time duration until it is reset by the reset system. The second SR latch 520 used in the reset system aims to keep the detection first SR latch 510 in reset mode in case the clock stays high after the "window size" time duration, otherwise it holds the reset mode only for "window size" delay. The "window size" is therefore variable between a minimum and maximum, set by the delay line circuit 530. Consequently, the edge detector output minimum cycle time is 2*minimum window size and thus, the maximum frequency is ½*minimum window size.

Figure 7:
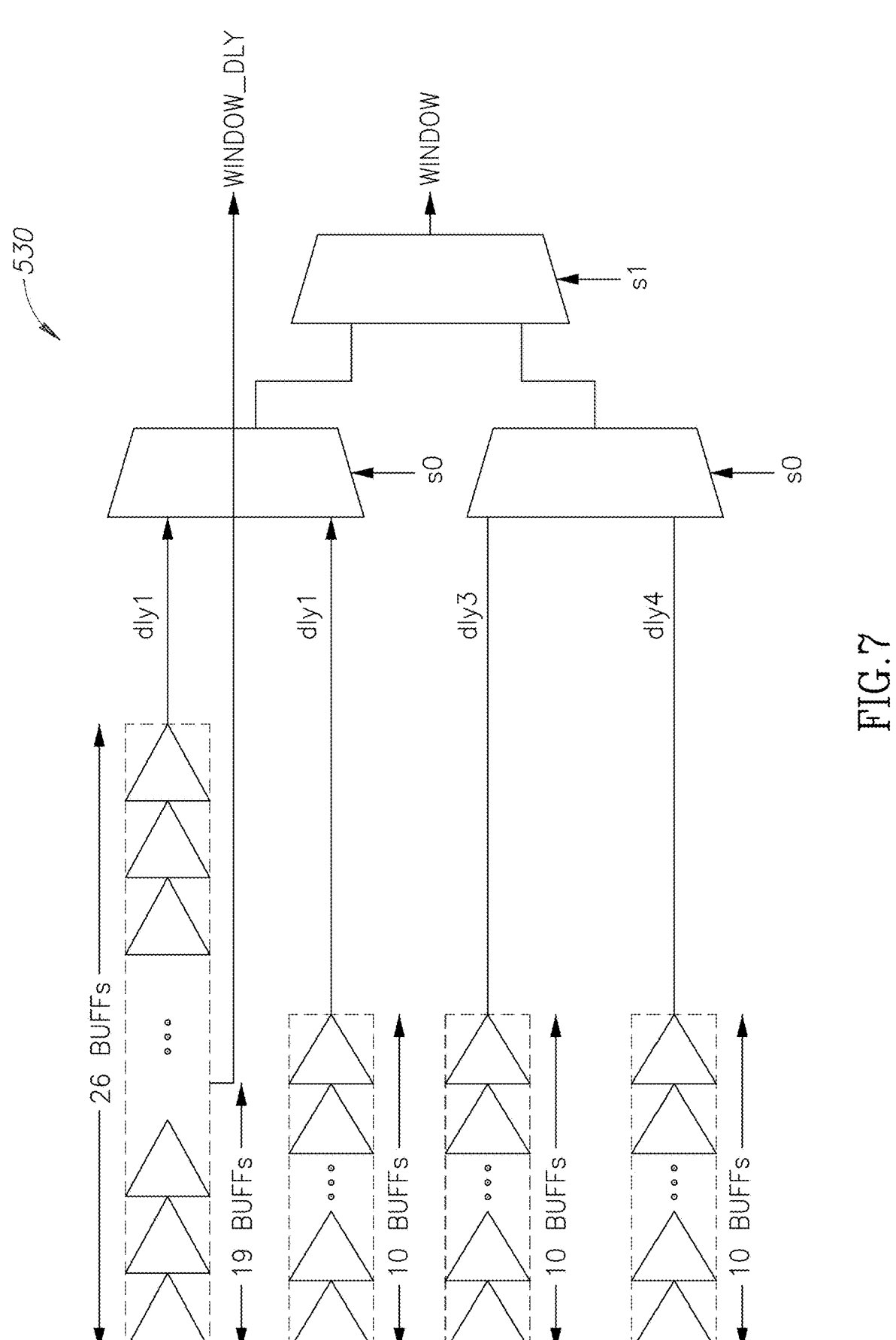
FIG. 7 shows a schematic block diagram of a delay line circuit for use in a device for glitch detection in accordance with an aspect of the disclosure.

Reference is made to FIG. 7, which shows a schematic block diagram of a delay line circuit 530, for instance, for use in the positive edge detector 415. Thus, the delay caused by the delay line circuit 530 may be adjusted, thereby allowing configuration of the pulse duration (window size). The delay line circuit 530 has two outputs: "window"; and "window_dly". The "window" output is opened every time edge detection occurs. The "window size" is optionally set in the range of the slope of the external reference clock signal edges, in order to distinguish between glitches during the edges and glitches during the phase. The "window_dly" output is used to observe the glitch events inside the window in the glitch detector. The basic principle of operation is that each time rising edge is detected in the clock, it is expected that the clock stays in high voltage for at least "window size"

time, and when it changes before this specific time means that there was a glitch, as will be discussed further below.

Figure 8:
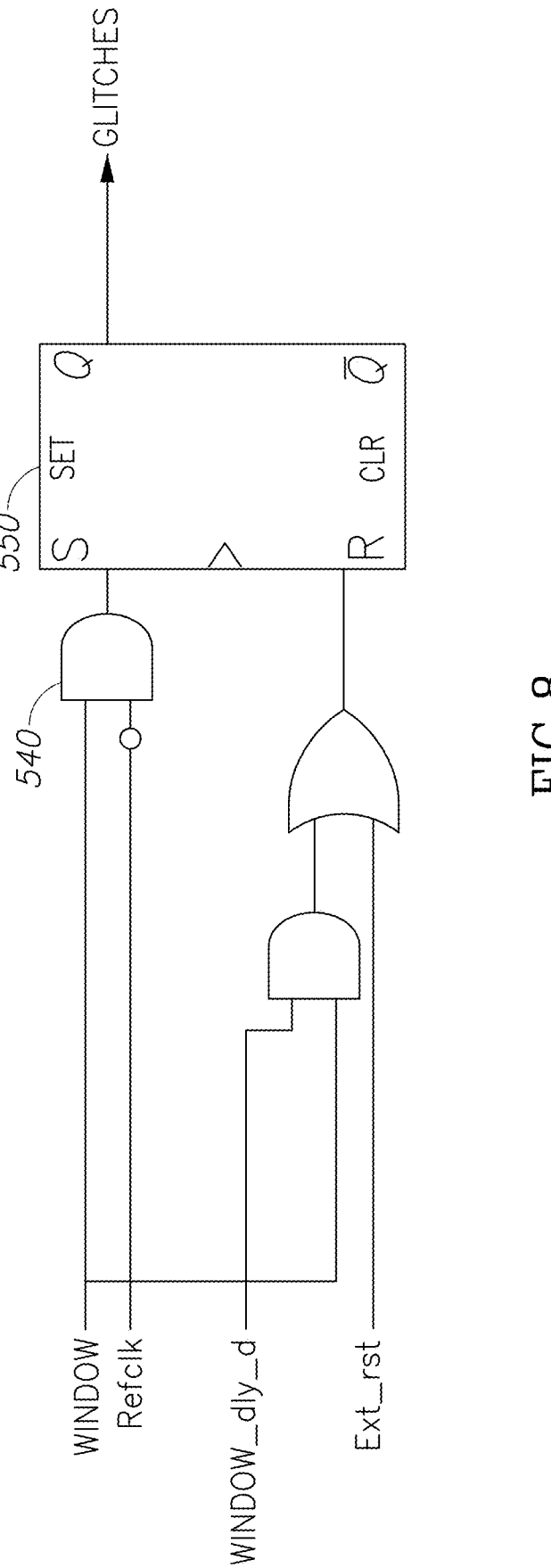
FIG. 8 shows a schematic block diagram of a glitch detector circuit for use in a device for glitch detection in accordance with an aspect of the disclosure.

Reference is made to FIG. 8, which shows a schematic block diagram of a glitch detector circuit for use in a device for glitch detection. This is based on a XOR-based gate (or NIMPLY gate, only producing a logical high output when a specific input is a logical high level and the other input is low) 540 and a SR latch 550, as shown. A "window" input (from the delay line circuit 530, as discussed above) opens because of a rising edge. Since the clock signal rise time is significantly smaller than the pulse duration ("window size"), it is expected that the clock signal stays high during the window period, unless a glitch occurs. To observe this, the XOR-based (NIMPLY) gate 540 receives the window signal and the clock signal as inputs and only produces a logical high output when the windows signal is logically high, but the clock signal is logically low. The output of the XOR-based gate 540 is transparent to the latch only after the delay ("dly") from window. This is done in order to look at the output of the XOR-based (NIMPLY) gate 540 after delay from the window, so that the effects of any "edge to window" delay and other undesired transitions near the edge can be mitigated.

Figure 9:
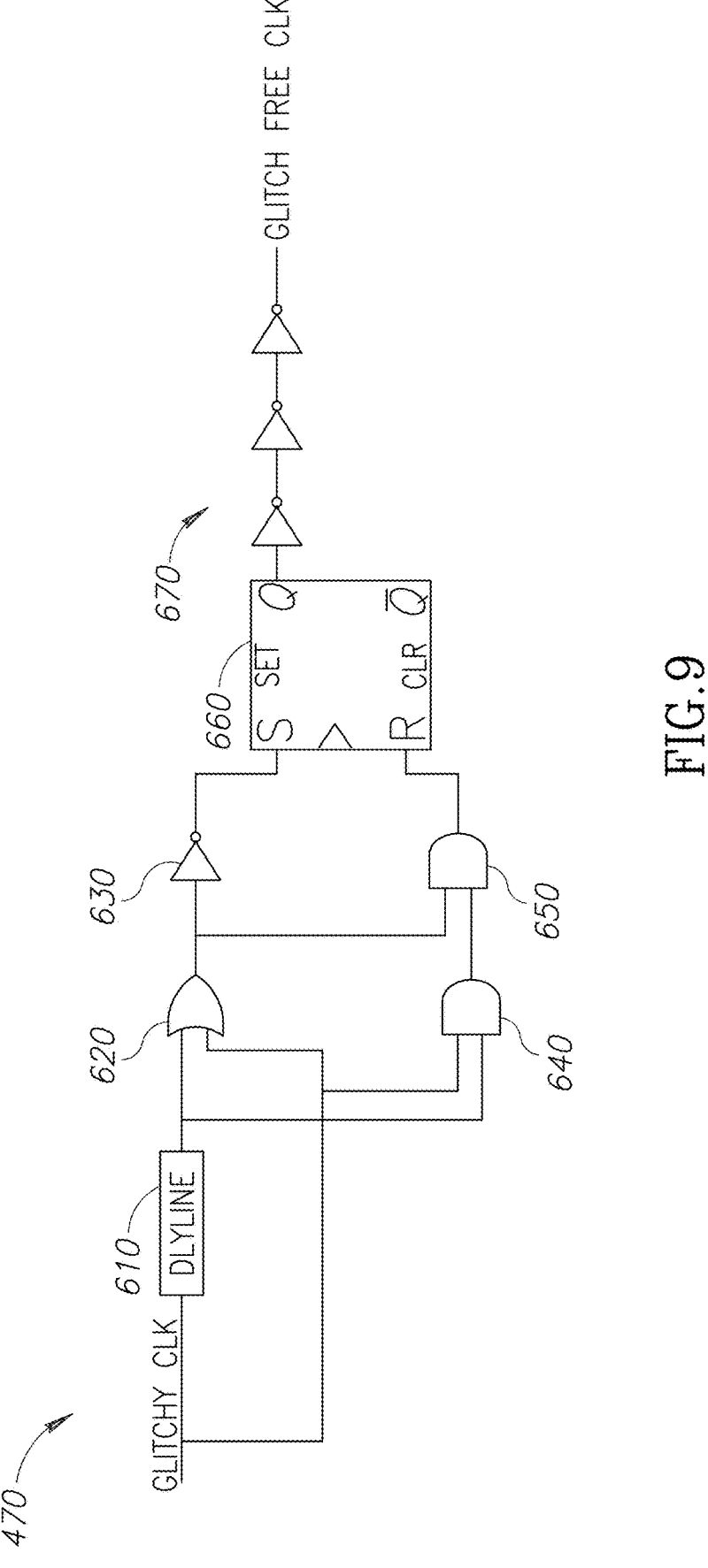
FIG. 9 shows a schematic block diagram of a glitch filter circuit for use in a device for glitch detection in accordance with an aspect of the disclosure.

Reference is made to FIG. 9, which shows a schematic block diagram of the glitch filter circuit 470 for use in the device for glitch detection (also, for edge-glitch and phase-glitch separation) 400. The glitch filter circuit 470 receives a clock signal with glitches (GLITCHY_CLK), which is provided to a delay line circuit 610 (which may be of the form shown in FIG. 7, for example). The clock signal with glitches and the delayed version of the clock signal with glitches are provided as inputs to an OR gate 620 and to a first AND gate 640. The output of the OR gate 620 and the output of the first AND gate 640 are provided to a second AND gate 650. The output of the OR gate 620 is also provided to a NOT gate 630. The output of the NOT gate 630 is provided to the set input of a SR latch 660. The output of the second AND gate 650 is provided to the reset input of the SR latch 660. The output of the SR latch 660 is provided to a NOT gate delay line 670 to provide a glitch-free clock output. The logic behind the SR latch 660 may ensure that one input is in a steady "0" (logical low) and the other is "1" (logical high) and may have glitches. The principal of operation is that the output of the SR latch 660 is not affected from the glitches in its high voltage input when the other input is held in "0". When the two inputs to the SR latch 660 are both "0", it works as a latch.

Figure 10:
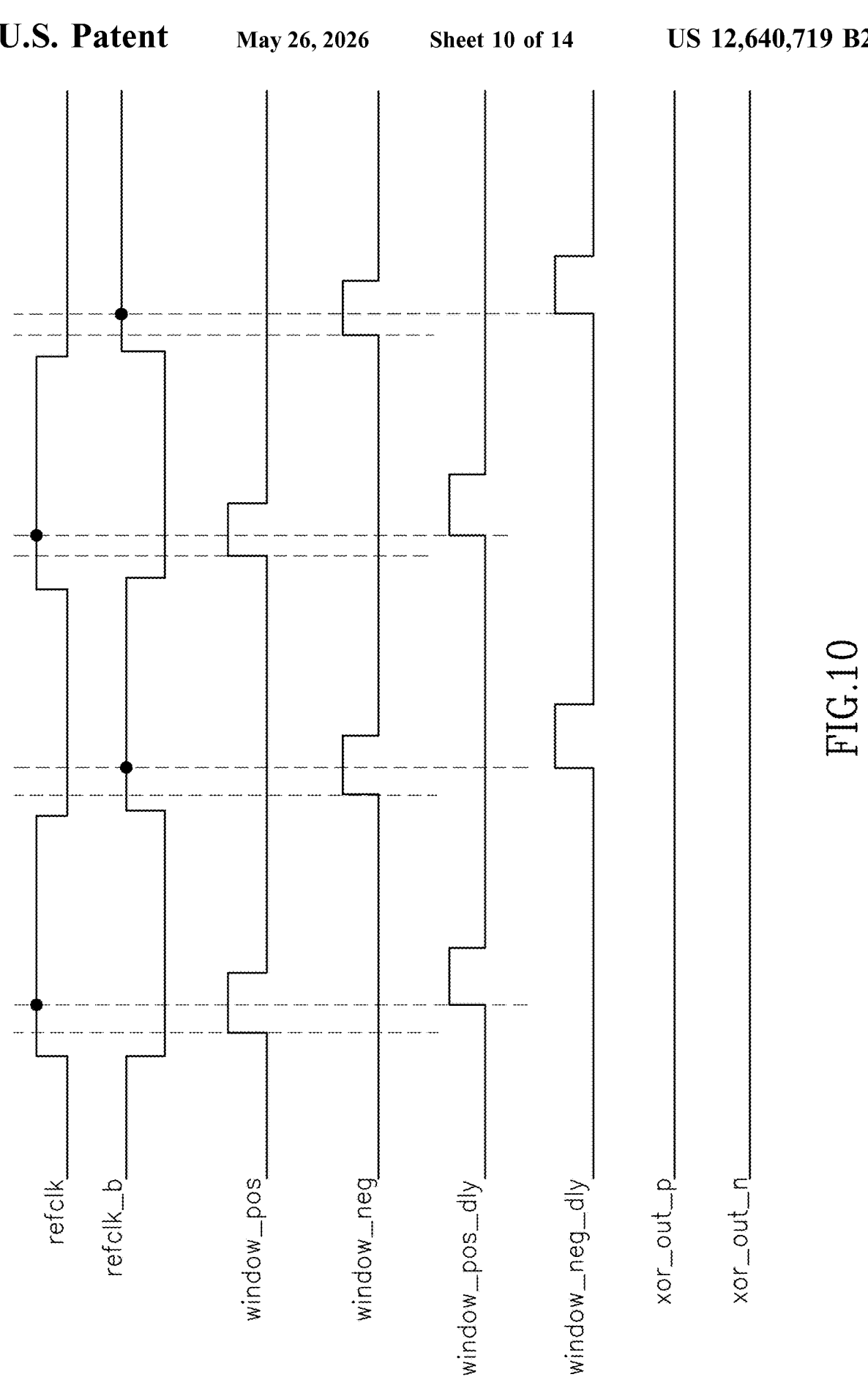
FIG. 10 shows a timing diagram for signals as part of a device for glitch detection in accordance with an aspect of the disclosure, in which no glitches occur.

Reference is now made to FIG. 10, which shows a timing diagram for signals as part of a device for glitch detection, for example the first device for glitch detection 200 or the second device for glitch detection 400. The clock signal (refclk) has no glitches. Each positive edge results in a positive edge signal (window_pos) producing a pulse. Each negative edge results in a negative edge signal (window_neg) producing a pulse. A delayed version of the positive edge signal (window_pos_dly) and a delayed version of the negative edge signal (window_neg_dly) are also generated. An XOR-based comparison of the positive edge signal (window_pos) with the clock signal while the delayed version of the positive edge signal is logical-high '1' (or its inverse version is logical-low '0') does not produce any high logic level output, so no positive glitch is indicated. Similarly, an XOR-based comparison of the negative edge signal with the inversed clock signal while the delayed version of the negative edge signal is logical-high '1' (or its inverse version is logical-low '0') does not produce any high logic level output, so no negative edge glitch is indicted.

Figure 11:
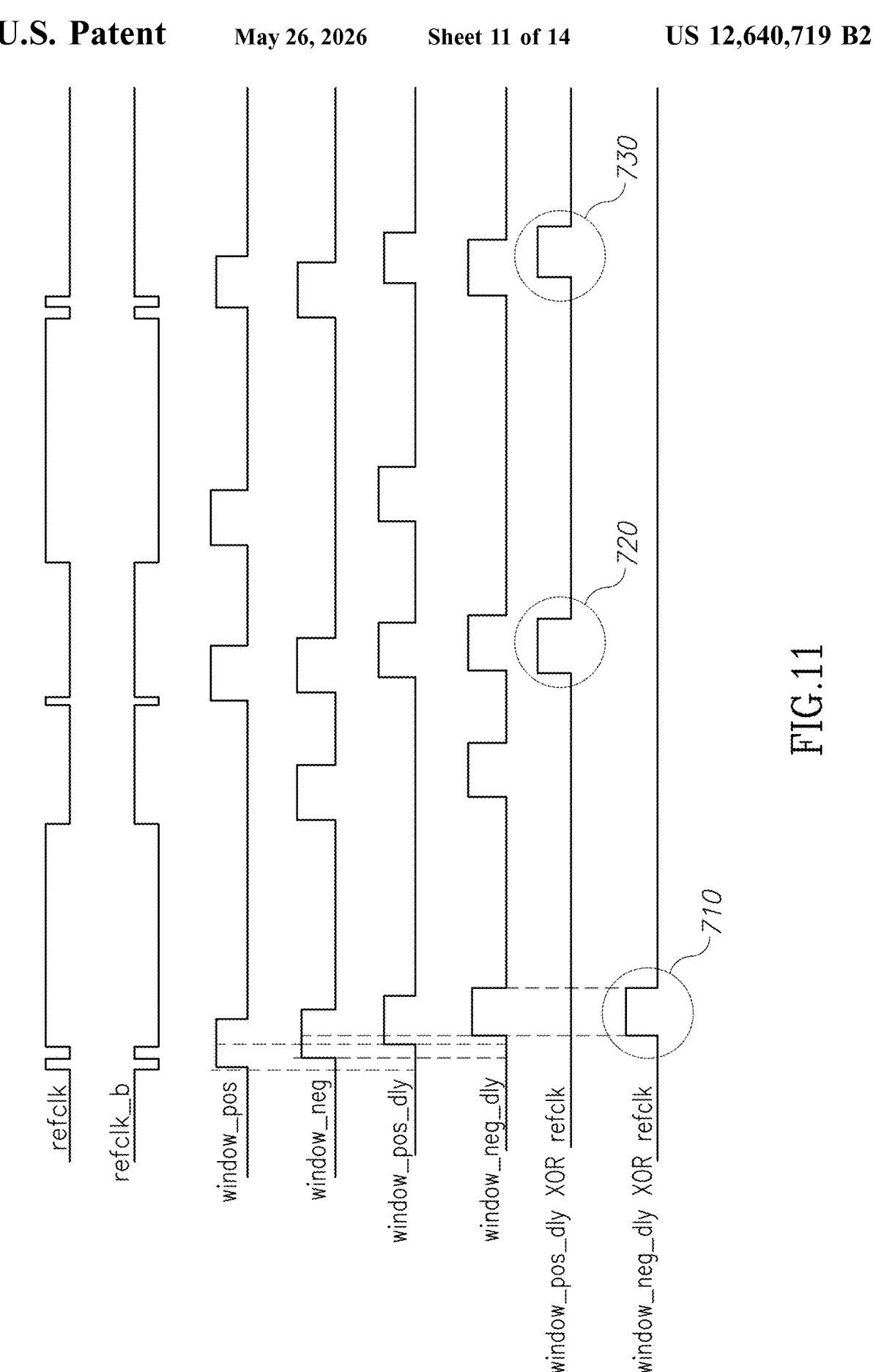
FIG. 11 shows a timing diagram for signals as part of a device for glitch detection in accordance with an aspect of the disclosure, in which glitches occur.

Reference is made to FIG. 11, which shows a timing diagram for signals as part of a device for glitch detection, for example the first device for glitch detection 200 or the second device for glitch detection 400. The clock signal (refclk) has glitches, as will be discussed below. As for FIG. 10, each positive edge results in a positive edge signal (window_pos) producing a pulse and each negative edge results in a negative edge signal (window_neg) producing a pulse. A delayed version of the positive edge signal (window_pos_dly) and a delayed version of the negative edge signal (window_neg_dly) are also generated. An XOR-based comparison of the positive edge signal (window_pos) with the clock signal while the delayed version of the positive edge signal is logical-high '1' (or its inverse version is logical-low '0') produces a first high logic level output 720, indicating a positive glitch and a second high logic level output 730, also indicating a positive glitch. In fact, the first high-logic level output 720 indicates a phase glitch, as will be discussed below. An XOR-based comparison of the negative edge signal (window-neg) with the inversed clock signal while the delayed version of the negative edge signal is logical-high '1' (or its inverse version is logical-low '0') produces a third high-logic level output 710, indicating a negative glitch.

Using the approach described herein, it is possible to differentiate between edge glitches and phase glitches. For example, the following procedure may be followed. The total clock transitions in the input-clock indicates how many transition events (Te) happened during the measurement time. When a glitch occurs, the glitch detection agent counts two windows (positive 'Wp' and Negative 'Wn') which corresponds to one clock transition (1 Te). When there is a clean edge (no glitches), the glitch detection agent counts one window, which also corresponds to one clock transition. In order to count the total clock transitions, without double counting, the total glitches can be subtracted from Wn+Wp, i.e. Total clock transitions=Wn+Wp−Total glitches. This reflects the sum of the numbers of: "clean edges" (A); "edges with slope glitch" (B); and "phase glitches" (C). The glitch-free clock generated by filtering the input clock signal can then be used to count the total number of edges. In the glitch-free clock, all the glitches are filtered, so that the total number of edges in the glitch-free clock is equal to the total number of edges of the input clock if no glitches occur (D). It should be noted that (D) is also equal to: "clean edges of the input clock" (A)+"edges with slope glitch" (B). Hence: Total phase glitches (C)=Total clock transitions of the input clock (A+B+C)−Total edges of the Glitch free clock (D). Moreover, Total slope glitches (B)=total glitches−total phase glitches (C).

This can then be used to count the number of slope glitches and the number of phase glitches over a determined time period, especially with reference to the embodiment described with reference to FIG. 5. The number of glitches=total positive glitches (from positive glitch counter 435)+total negative glitches (from negative glitch counter 430). The number of windows=total Wn (from negative edge counter 450)+Total Wp (from positive edge counter 460)−the number of total glitches (as calculated above). The number of glitch free edges=the number of negative edges (from filtered clock negative edge counter 480)+the number of positive edges (from filtered clock positive edge counter 490). Then, the number of phase glitches=the number of windows (as calculated above)−the number of glitch free edges (as calculated above). Finally, the number of slope glitches=the number of glitches (as calculated above)−the number of phase glitches (as calculated above).

Figure 12:
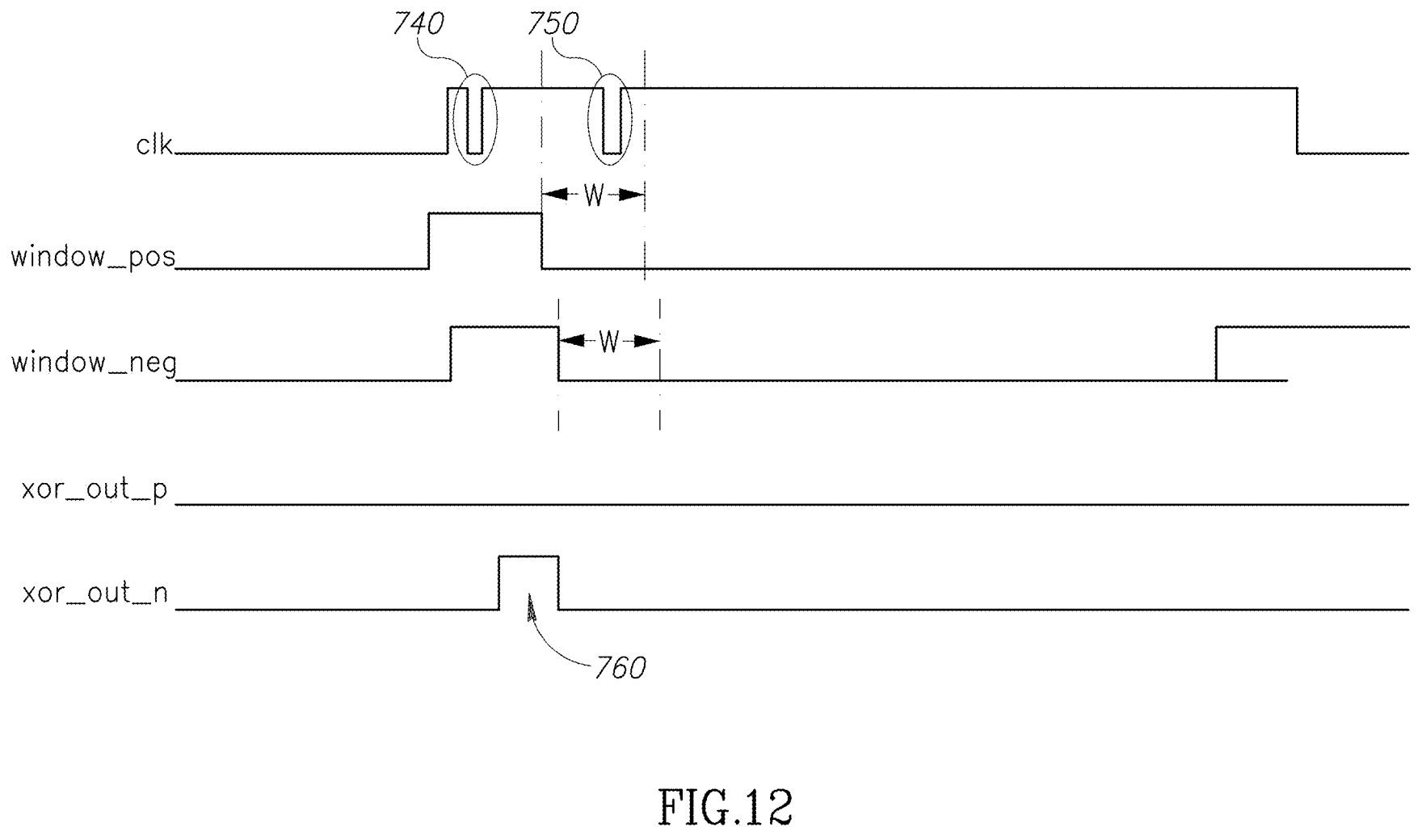

Reference is made to FIG. 12, which shows a timing diagram for signals as part of a device for glitch detection (for example the first device for glitch detection 200 or the second device for glitch detection 400), depicting resolution for detectable glitches. The clock signal includes a first glitch 740 (which may be a rising edge glitch) and a second glitch 750 (which may be a phase glitch). The first glitch 740 is detected by the delayed falling edge pulse signal having the same logical level as the clock signal (equivalent to an XOR between the inversed clock signal and the delayed falling edge pulse signal resulting in a high logical level output), as shown by pulse 760. Since the edge detector is based on a self-reset system, there is a period of time ("W") in which the window is reset. This may create a "blind" time period, during which glitches, including the second glitch 750, are not sensed and are counted with the glitches inside the window pulse. A detectable glitch therefore occurs inside the window, such that the event resolution for detectable glitches is 2W.

Figure 13:
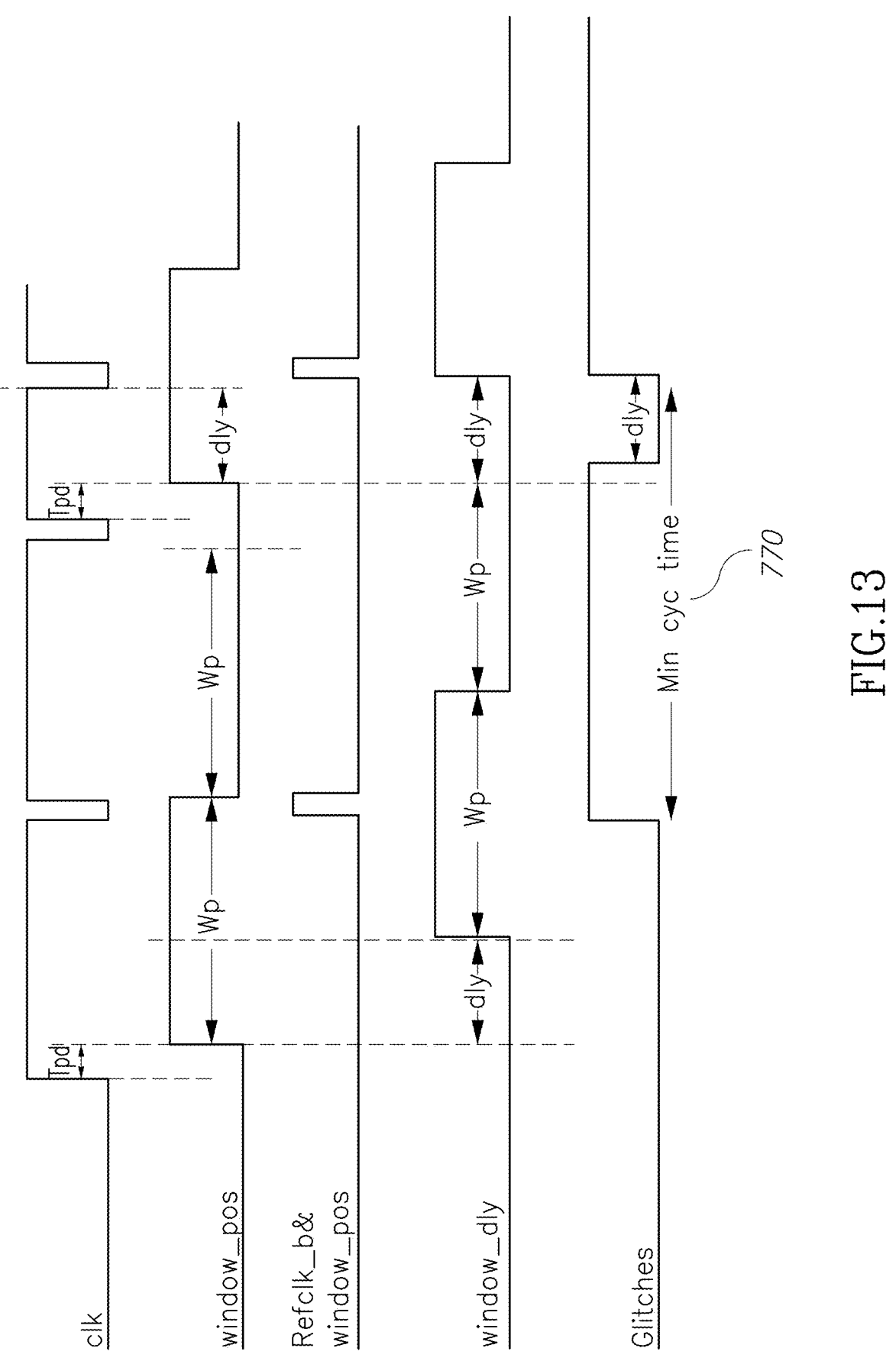
FIG. 13 shows a timing diagram for signals as part of a device for glitch detection in accordance with an aspect of the disclosure, depicting a timing worst case scenario.

Reference is made to FIG. 13, which shows a timing diagram for signals as part of a device for glitch detection, depicting a timing worst case scenario. This shows the length of the "window" (pulse) for the rising edge detection as "Wp". The minimum XOR_OUT pulse width is given by Wp+Minimum glitch width+Tpd, where Tpd=2*NOR_DLY+INV_DLY. The Minimum XOR_OUT Cycle Time is given by XOR_OUT pulse width+dly.

In a generalized sense, there may therefore be considered a glitch detection circuit for a clock signal in a semiconductor integrated circuit (IC). The glitch detection circuit advantageously comprises: an edge detector, configured to generate a first pulse signal (particularly, a positive pulse) in response to a rising edge of the clock signal and a second pulse signal (particularly, a positive pulse) in response to a falling edge of the clock signal; a delayed-pulse generator, configured to generate a third pulse signal at (or starting from) a predetermined period of time after a start of the first pulse signal and to generate a fourth pulse signal at (or starting from) a predetermined period of time after a start of the second pulse signal; and a glitch identifier, arranged to indicate a glitch in the clock signal based on the third pulse signal having an opposite logical level to the clock signal and/or based on the fourth pulse signal having the same logical level as the clock signal. Optionally, a semiconductor Integrated Circuit (IC) may be provided, comprising a glitch detection circuit as disclosed herein, arranged to receive a clock signal, analyze the received clock signal and generate a signal indicating a glitch on the clock signal based on results of the analyzing.

This approach allows a glitch to be detected on the basis that when a positive (rising) signal edge occurs, the clock signal should still be at a logical high level a short time (shorter and optionally significantly shorter than the clock period) after the positive signal edge occurrence. Similarly, when a negative (falling) signal edge occurs, the clock signal should still be a logical low level (or an inverse of the clock signal should be at a logical high level) a short time (shorter and optionally significantly shorter than the clock period) after the negative signal edge occurrence. If either is not the case, a glitch is present. A pulse signal in the form of the positive pulse can be generated upon a signal edge, delayed in some way (by a delay line or by generating a further pulse from the initial pulse) and compared with the clock signal (by an XOR or NIMPLY gate) or in order to identify a glitch. It will be appreciated that a negative pulse may alternatively be generated (where the pulse starts with a falling edge and ends with a rising edge), but that the technique would be applied in the corresponding way, for example with the pulse being considered to be a high logical level or inverting the pulse before comparing it with the clock signal.

In embodiments, a duration of the first pulse signal (or third pulse signal) is adjustable and/or a duration of second pulse signal (or fourth pulse signal) is adjustable. Adjustment of the pulse duration may allow distinguishing between slope glitches and phase glitches, resolution customization and optimization in view of clock signal periodicity.

In embodiments, the first pulse signal (or third pulse signal) and/or second pulse signal (or fourth pulse signal) are configured to have a duration of less than (or no more than) 50%, 40%, 30%, 20% 25%, 15% or 10% of a period of the clock signal. In other words, the pulse duration is less than the clock period and optionally significantly less than the clock period. This may allow slope glitches and phase glitches to be detected. A short pulse duration may be advantageous so that a phase glitch can be detected following a signal edge.

Optionally, the predetermined period of time for generating the third pulse signal is no more than 75%, 50% or 25% of a duration the first pulse signal and/or the predetermined period of time for generating the fourth pulse signal is no more than 75%, 50% or 25% of a duration the second pulse signal. In this way, the delayed pulse signal may overlap with the initially generated pulse signal.

Advantageously, the glitch identifier is configured to maintain a plurality of counters. Optionally, the plurality of counters comprises: a first counter, configured to count each indication of a glitch over a time period, based on third pulse signal having an opposite logical level to the clock signal and/or based on the fourth pulse signal having the same logical level as the clock signal (for instance using two counter parts to count the two events, which may then be summed); a second counter, configured to count over the time period each generation of the first pulse signal and each generation of the second pulse signal; and a third counter, configured to count over the time period the number of edges in a glitch-free version of the clock signal. Optionally, the glitch identifier is further arranged to determine the number of phase glitches over the time period by subtracting the count provided by the first counter and the count provided by the third counter from the count provided by the second counter. Optionally, the glitch identifier is further arranged to determine the number of slope glitches over the time period by subtracting the determined number of phase glitches from the count provided by the first counter.

In embodiments, the glitch detection circuit further comprises: a glitch-free clock generator, configured to provide a glitch-free version of the clock signal (from the clock signal, for example by filtering the clock signal). For instance, the glitch-free clock generator may comprise: a clock input, for receiving the clock signal with glitches; a delay circuit (or delay line), for receiving (or configured to receive) the clock signal with glitches from the clock input and providing (or configured to provide) a delayed version of the received clock signal with glitches; an OR gate, configured to receive the clock signal with glitches from the clock input at a first OR gate input and to receive the delayed version of the received clock signal with glitches from the delay circuit at a second OR gate input (so as to provide an output that is logically high if at least one input is logically high or an output that is logically low otherwise); an AND gate, configured to receive the clock signal with glitches from the clock input at a first AND gate input and to receive the delayed version of the received clock signal with glitches from the delay circuit at a second AND gate input (so as to provide an output that is logically high if both inputs are logically high or an output that is logically low otherwise); and a SR latch configured to receive a signal based on an output of the OR gate (in particular, the output of the OR inverted by a NOT gate) as at a first SR latch input (a set input, for instance) and to receive a signal based on an output of the AND gate (particularly, an output of a second AND gate having the first AND gate output as one input and the OR gate output as the second input) the at a second SR latch input (a reset input, for instance), an output of the SR latch (optionally inverted) being used to provide the glitch-free version of the clock signal. Optionally, this may be provided independently from other features disclosed herein.

In another generalized sense, there may be considered a method for detecting a glitch of a clock signal in a semi-conductor integrated circuit (IC), the method comprising: generating a first pulse signal in response to a rising edge of the clock signal and a second pulse signal in response to a falling edge of the clock signal; generating a third pulse signal at (or starting from) a predetermined period of time after a start of the first pulse signal and generating a fourth pulse signal at (or starting from) a predetermined period of time after a start of the second pulse signal; and indicating a glitch in the clock signal based on third pulse signal having an opposite logical level to the clock signal and/or based on the fourth pulse signal having the same logical level as the clock signal. Any of the features described above with reference to the glitch detection circuit may also optionally be applied to this method.

For example, the method may further comprise: counting each indication of a glitch over a time period, based on third pulse signal having an opposite logical level to the clock signal and/or based on the fourth pulse signal having the same logical level as the clock signal, to provide a first count; counting over the time period each generation of the first pulse signal and each generation of the second pulse signal to provide a second count; and counting over the time period the number of edges in a glitch-free version of the clock signal to provide a third count. Then, the method may further comprise determining the number of phase glitches over the time period by subtracting the first count and the third count from the second count and optionally, determining the number of slope glitches over the time period by subtracting the determined number of phase glitches from the first count.

In embodiments, the method further comprises providing a glitch-free version of the clock signal (for instance, from the clock signal, for example by filtering the clock signal). The step of providing a glitch-free version of the clock signal may comprise: providing a delayed version of the received clock signal with glitches (using a delay circuit or delay line); receiving the clock signal with glitches at a first input of an OR gate and receiving the delayed version of the received clock signal with glitches at a second input of the OR gate (so as to provide an output that is logically high if at least one input is logically high or an output that is logically low otherwise); receiving the clock signal with glitches at a first input of an AND gate and receiving the delayed version of the received clock signal with glitches at a second input of the AND gate (so as to provide an output that is logically high if both inputs are logically high or an output that is logically low otherwise); and receiving a signal based on an output of the OR gate (in particular, the inverted output of the OR gate) at a first input of a SR latch (a set input, for instance) and receiving a signal based on an output of the AND gate (particularly, an output of a second AND gate having the first AND gate output as one input and the OR gate output as the second input) at a second input of the SR latch (a reset input, for instance), an output of the SR latch being used to provide the glitch-free version of the clock signal. Optionally, this may be provided independently from other features disclosed herein.

Figure 14:
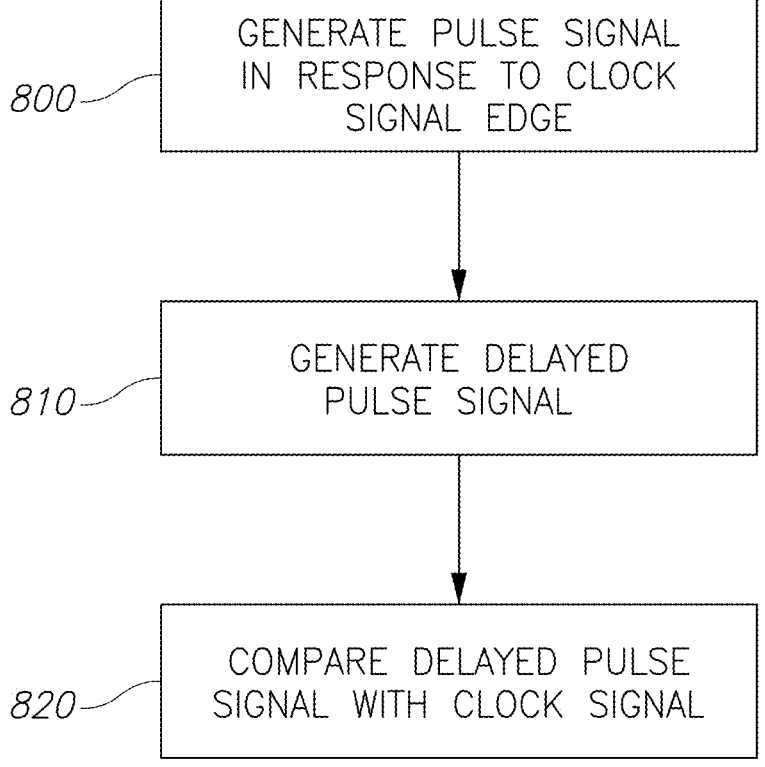
FIG. 14 shows a flowchart of a method in line with the disclosure.

Reference is made to FIG. 14, which shows a flowchart of a method in line with the disclosure. In a first step 800, a pulse signal is generated in response to clock signal edge. One pulse signal may be generated for a rising edge and another pulse signal may be generated for a falling edge. In a second step 810, a delayed version of the pulse signal is generated. The delay and/or the duration of the delayed pulse may be adjustable. The delayed version of the pulse signal is compared with the clock signal in a third step 820. If the delayed version of the pulse signal indicates a positive edge and the clock signal is low and/or if the delayed version of the pulse signal indicates a negative edge and the clock signal is high, a glitch is indicated.

Throughout this disclosure, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein and, in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL operating at exemplary frequencies, the teachings of the present invention are believed advantageous for use with other types of circuitry in which a circuit element, such as an inductor, may benefit from electromagnetic shielding. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

A range of circuit designs and schematics are described herein. It will be appreciated that these circuit designs can be embodied in an electronic (also 'digital') representation (also 'encoding'). The electronic representation may be stored in a computer readable medium, particularly of a non-transitory nature. A suitable electronic representation may include a representation for Electronic Computer-Aided Design (ECAD) software, also referred to as Electronic Design Automation (EDA) software. In this case, parts of the representation may be stored across multiple electronic documents or files, possibly including one or more libraries of the ECAD software providing details of the components of the circuit. The ECAD representation may provide instructions suitable for manufacture (also 'fabrication') of a circuit as represented in the design. According to the disclosure, there may be provided such an electronic representation. A method of using such an electronic representation of an electronic circuit as part of manufacturing the electronic circuit is further considered.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in 14 the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The skilled person will appreciate that combinations and sub-combinations of specific features disclosed herein may also be provided, even if not explicitly described.

What is claimed is:

1. A glitch detection circuit for a clock signal in a semiconductor integrated circuit (IC), the glitch detection circuit comprising:

an edge detector, configured to generate a first pulse signal in response to a rising edge of the clock signal and a second pulse signal in response to a falling edge of the clock signal;

a delayed-pulse generator, configured to generate a third pulse signal at a predetermined period of time after a start of the first pulse signal and to generate a fourth pulse signal at a predetermined period of time after a start of the second pulse signal; and a glitch identifier, configured to indicate a glitch in the clock signal based on at least one of the following:

the third pulse signal having an opposite logical level to the clock signal, or the fourth pulse signal having the same logical level as the clock signal.

2. The glitch detection circuit of claim 1, wherein a duration of at least one of the first or second pulse signals is adjustable.

3. The glitch detection circuit of claim 1, wherein at least one of the first or second pulse signals is configured to have a duration of less than 20% of a period of the clock signal.

4. The glitch detection circuit of claim 1, wherein:

the predetermined period of time for generating the third pulse signal is no more than 50% of a duration of the first pulse signal; and/or the predetermined period of time for generating the fourth pulse signal is no more than 50% of a duration of the second pulse signal.

5. The glitch detection circuit of claim 1, wherein the glitch identifier is configured to maintain a plurality of counters, the plurality of counters comprising:

a first counter, configured to count each indication of a glitch over a time period, based on the third pulse signal having an opposite logical level to the clock signal and/or based on the fourth pulse signal having the same logical level as the clock signal;

a second counter, configured to count over the time period each generation of the first pulse signal and each generation of the second pulse signal; and a third counter, configured to count over the time period the number of edges in a glitch-free version of the clock signal.

6. The glitch detection circuit of claim 5, wherein the glitch identifier is further configured to determine the number of phase glitches over the time period by subtracting the count provided by the first counter and the count provided by the third counter from the count provided by the second counter.

7. The glitch detection circuit of claim 6, wherein the glitch identifier is further configured to determine the number of slope glitches over the time period by subtracting the determined number of phase glitches from the count provided by the first counter.

8. The glitch detection circuit of claim 1, further comprising a glitch-free clock generator configured to provide a glitch-free version of the clock signal, wherein the glitch-free clock generator comprises:

a clock input, for receiving the clock signal with glitches;

a delay circuit, for receiving the clock signal with glitches from the clock input and providing a delayed version of the received clock signal with glitches;

an OR gate, configured to receive the clock signal with glitches from the clock input at a first OR gate input and to receive the delayed version of the received clock signal with glitches from the delay circuit at a second OR gate input;

an AND gate, configured to receive the clock signal with glitches from the clock input at a first AND gate input and to receive the delayed version of the received clock signal with glitches from the delay circuit at a second AND gate input; and an SR latch configured to receive a signal based on an output of the OR gate at a first SR latch input and to receive a signal based on an output of the AND gate at a second SR latch input, an output of the SR latch being used to provide the glitch-free version of the clock signal.

9. A semiconductor Integrated Circuit (IC), comprising:

the glitch detection circuit of claim 1, further configured to receive the clock signal, analyze the received clock signal, and generate a signal indicating the glitch in the clock signal based on the analysis.

10. The semiconductor IC of claim 9, further comprising:

an input buffer, configured to receive the clock signal; and a Phase Locked Loop (PLL), configured to receive the clock signal from the input buffer;

wherein the glitch detection circuit is configured to receive the clock signal from the input buffer and/or from the PLL.

11. The semiconductor IC of claim 10, further comprising:

a PLL protection circuit, configured to mitigate a jitter effect on the clock signal at the PLL, in response to the signal indicating the glitch in the clock signal.

12. A non-transitory computer readable medium having stored thereon a computer-readable encoding of a glitch detection circuit for a clock signal in a semiconductor integrated circuit (IC), the glitch detection circuit comprising:

an edge detector, configured to generate a first pulse signal in response to a rising edge of the clock signal and a second pulse signal in response to a falling edge of the clock signal;

a delayed-pulse generator, configured to generate a third pulse signal at a predetermined period of time after a start of the first pulse signal and to generate a fourth pulse signal at a predetermined period of time after a start of the second pulse signal; and a glitch identifier, configured to indicate a glitch in the clock signal based on at least one of the following:

the third pulse signal having an opposite logical level to the clock signal, or the fourth pulse signal having the same logical level as the clock signal.

13. The non-transitory computer readable medium of claim 12, wherein a duration of at least one of the first or second pulse signals is adjustable.

14. The non-transitory computer readable medium of claim 12, wherein at least one of the first or second pulse signals is configured to have a duration of less than 20% of a period of the clock signal.

15. The non-transitory computer readable medium of claim 12, wherein:

the predetermined period of time for generating the third pulse signal is no more than 50% of a duration of the first pulse signal; and/or the predetermined period of time for generating the fourth pulse signal is no more than 50% of a duration of the second pulse signal.

16. The non-transitory computer readable medium of claim 12, wherein the glitch identifier is configured to maintain a plurality of counters, the plurality of counters comprising:

a first counter, configured to count each indication of a glitch over a time period, based on the third pulse signal having an opposite logical level to the clock signal and/or based on the fourth pulse signal having the same logical level as the clock signal;

a second counter, configured to count over the time period each generation of the first pulse signal and each generation of the second pulse signal; and a third counter, configured to count over the time period the number of edges in a glitch-free version of the clock signal.

17. The non-transitory computer readable medium of claim 16, wherein the glitch identifier is further configured to determine the number of phase glitches over the time period by subtracting the count provided by the first counter and the count provided by the third counter from the count provided by the second counter.

18. The non-transitory computer readable medium of claim 17, wherein the glitch identifier is further configured to determine the number of slope glitches over the time period by subtracting the determined number of phase glitches from the count provided by the first counter.

19. The non-transitory computer readable medium of claim 12, further comprising a glitch-free clock generator configured to provide a glitch-free version of the clock signal, wherein the glitch-free clock generator comprises:

a clock input, for receiving the clock signal with glitches;

a delay circuit, for receiving the clock signal with glitches from the clock input and providing a delayed version of the received clock signal with glitches;

an OR gate, configured to receive the clock signal with glitches from the clock input at a first OR gate input and to receive the delayed version of the received clock signal with glitches from the delay circuit at a second OR gate input;

an AND gate, configured to receive the clock signal with glitches from the clock input at a first AND gate input and to receive the delayed version of the received clock signal with glitches from the delay circuit at a second AND gate input; and an SR latch configured to receive a signal based on an output of the OR gate at a first SR latch input and to receive a signal based on an output of the AND gate at a second SR latch input, an output of the SR latch being used to provide the glitch-free version of the clock signal.

20. The non-transitory computer readable medium of claim 12, having further stored thereon a computer-readable encoding of:

an input buffer, configured to receive the clock signal;

a Phase Locked Loop (PLL), configured to receive the clock signal from the input buffer; and a PLL protection circuit, configured to mitigate a jitter effect on the clock signal at the PLL, in response to the signal indicating the glitch in the clock signal, wherein the glitch detection circuit is configured to receive the clock signal from the input buffer and/or from the PLL.

* * * * *